US 6,377,425 B1

(12) United States Patent
Khan

(10) Patent No.: US 6,377,425 B1
(45) Date of Patent: *Apr. 23, 2002

(54) ONE-PIECE LOAD BEAM AND GIMBAL FLEXURE USING FLEXIBLE CIRCUIT

(75) Inventor: Amanullah Khan, Temecula, CA (US)

(73) Assignee: Magnecomp Corporation, Temecula, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/871,412

(22) Filed: May 30, 2001

Related U.S. Application Data

(63) Continuation of application No. 09/685,515, filed on Oct. 9, 2000, now Pat. No. 6,266,214, which is a continuation of application No. 09/292,538, filed on Apr. 15, 1999, now Pat. No. 6,147,840.

(51) Int. Cl.[7] .............................. G11B 5/48; G11B 21/16
(52) U.S. Cl. .............................. 360/245.9; 360/245.5; 29/603.03
(58) Field of Search ........................ 360/245.9, 245.5, 360/245, 245.3, 244.3; 29/603.03

(56) References Cited

U.S. PATENT DOCUMENTS

| 4,996,623 | A | * | 2/1991 | Erpelding et al. ........... 360/104 |
| 5,282,102 | A | * | 1/1994 | Christianson ................ 360/104 |
| 5,519,552 | A | * | 5/1996 | Kohira et al. ............... 360/104 |
| 5,598,307 | A | * | 1/1997 | Bennin ....................... 360/104 |
| 5,701,218 | A | * | 12/1997 | Boutaghou ................... 360/104 |
| 5,786,964 | A | * | 7/1998 | Sone et al. .................. 360/106 |
| 5,796,556 | A | * | 8/1998 | Boutaghou ................... 360/104 |
| 5,818,662 | A | * | 10/1998 | Shum ......................... 360/104 |
| 5,955,176 | A | * | 9/1999 | Erpelding et al. ........... 360/104 |
| 5,982,584 | A | * | 11/1999 | Bennin et al. .............. 360/104 |
| 5,995,328 | A | * | 11/1999 | Balakrishnan .............. 360/104 |
| 6,014,290 | A | * | 1/2000 | Supramaniam et al. ..... 360/104 |
| 6,021,022 | A | * | 2/2000 | Himes et al. ............... 360/104 |
| 6,046,887 | A | * | 4/2000 | Uozumi et al. ............. 360/104 |
| 6,055,131 | A | * | 4/2000 | Takahashi et al. .......... 360/104 |
| 6,125,015 | A | * | 9/2000 | Carlson et al. ............ 360/245.9 |
| 6,147,840 | A | * | 11/2000 | Khan ....................... 360/245.9 |
| 6,266,214 | B1 | * | 7/2001 | Khan ....................... 360/245.9 |

FOREIGN PATENT DOCUMENTS

| JP | 7-029340 | * | 1/1995 |
| JP | 9-251742 | * | 9/1997 |
| JP | 11-1086253 | * | 3/1999 |

* cited by examiner

Primary Examiner—William Klimowicz
(74) Attorney, Agent, or Firm—Louis J. Bachand

(57) ABSTRACT

A disk drive suspension has a lower stiffness gimbal flexure formed in one piece with a load beam by setting off the flexure frame from the load beam rigid portion, reducing the frame thickness by partial etch, maintaining the flexure tongue thickness at that of the load beam rigid portion, and completing the flexure frame with flexible conductor connected to the distal end of the frame, metal layer in the flexible conductor being removed to maintain low stiffness while connecting the flexible conductor to the flexure tongue in motion limiting relation.

10 Claims, 3 Drawing Sheets

ONE-PIECE LOAD BEAM AND GIMBAL FLEXURE USING FLEXIBLE CIRCUIT

REFERENCE TO RELATED APPLICATIONS

This application is a continuation of U.S. patent application, Ser. No. 09/685,515, filed Oct. 9, 2000, now U.S. Pat. No. 6,266,214, which in turn is a continuation of U.S. Pat. application, Ser. No. 09/292,538, filed Apr. 15, 1999, now U.S. Pat. No. 6,147,840.

BACKGROUND OF THE INVENTION

1. Field of the Invention

This invention relates to disk drive suspensions, and more particularly to load beams for such suspensions having an integrated gimbal flexure, that is a gimbal flexure formed from the metal web of the load beam and unitary and integral with the load beam. Certain of the gimbal flexure components are partially etched to provide reduced stiffness and increased gimbal responsiveness. A flexible circuit carrying conductors is connected to the gimbal flexure frame outriggers to complete the gimbal flexure frame with less stiffness than a completely steel flexure, and is connected to the flexure tongue to limit flexure tongue excursions.

2. Related Art

In disk drives, the read-write head is carried in a slider suspended from a suspension flexure comprising a tongue typically gimbaled on a dimple. As sliders decrease in size, design problems that can be overlooked in larger devices become critical with pico and nano sized sliders the need for increased flexibility of the flexure becomes paramount. A convenient style of flexure is one integrated into the load beam by forming the flexure features (flexure frame and tongue) at the time of load beam formation from a single, unitary web of stainless steel. The steel of the load beam is more properly designed for the requirements of the load beam and is often too stiff and thus ill-suited for forming a flexure, particularly where the slider is pico or nano-sized and lacks mass

SUMMARY OF THE INVENTION

Symmetric gimbal flexure design provides a relatively high pitch and roll stiffness. Reducing the gimbal flexure stiffness increases the tendency to unwanted out-of-plane motion. The invention provides a more flexible gimbal flexure having a softer response characteristic, but offers the convenience of fabrication as an integral part of the load beam. Additionally, the invention uses wireless electrical connection through a flexible circuit comprising a laminate of a base layer, a dielectric layer and plural conductors. The flexible circuit is not relied on to form the flexure and thus problems of attachment between the flexible circuit and the load beam are obviated. The flexible circuit, however, does enter into formation of the gimbal flexure as a softer component than the load beam steel, and also serves to limit unwanted excursions of the tongue and control its out-of-plane movement. Further, in the present invention, the slider is permitted to pitch about the transverse axis (normal to the long axis). The gimbal flexure is free to move with the flexible circuit attached at the gimbal flexure front end and thus utilize the softer properties of the flexible circuit in comparison with the steel. As a further feature the flexure tongue has its distal end as its free end rather than the conventional proximate end being free, for improved gimbaling and linear pitch motion. Additionally, the invention, using an integrated flexure, avoids the welding of the gimbal flexure to the load beam and provides a bond pad situs that may be more precise than found with welded flexible circuit flexure devices.

It is an object of the invention, accordingly, to provide a disk drive suspension having a low stiffness gimbal flexure, partially formed from the load beam, and partially from flexible circuit. It is another object to provide a suspension with a gimbal flexure having a frame and tongue etched from the load beam, the frame being locally partially etched to reduce frame stiffness, but not the tongue, and the frame sides defining an open end and coupled to each other at their distal ends across the frame open end by the flexible circuit, the flexible circuit itself in its nonconductive components being reduced to its dielectric layer except where connected to the frame and tongue to provide a soft linking of the frame sides across the open end of the frame.

These and other objects of the invention to become apparent hereinafter are realized in a disk drive suspension having a low stiffness gimbal flexure and comprising a flexible circuit and a one-piece load beam and gimbal flexure, the flexible circuit comprising a laminate of a conductor, a plastic film layer and a metal layer, the load beam supporting the flexible circuit and having a distal end comprising a rigid portion, the load beam rigid portion being selectively etched to define within the plane of the rigid portion the gimbal flexure comprising a flexure frame generally spaced from the rigid portion across a gap, the flexure frame being locally connected at its left and right sides to the rigid portion across the gap to support the flexure frame in place, the gimbal flexure further comprising a flexure tongue cantilevered from the proximate end of the flexure frame toward the flexure frame distal end, the flexible circuit having a distal portion extending beyond the load beam rigid portion and connected to the distal end of the flexure tongue and to each of the flexure frame sides, the flexible circuit distal portion being free of its the metal layer except where so connected.

In this and like embodiments, typically: the load beam rigid portion has a first thickness, and the gimbal flexure frame is reduced to a second, lesser thickness for lower stiffness in the gimbal flexure; the gimbal flexure frame is surface etched to the lesser thickness; the tongue has a greater thickness than the gimbal flexure frame; the load beam rigid portion has a first thickness, the gimbal flexure frame has a second, lesser thickness, and the tongue has the thickness of the load beam rigid portion; the gimbal flexure frame is generally U-shaped; the gimbal flexure frame has a proximate end, left and right legs extending distally from the proximate end to define the flexure frame sides, and an open distal end, the flexure frame being supported on the load beam rigid portion intermediate the length of the flexure frame legs; the flexure frame legs have distal terminals and flexible circuit distal portion is connected to the flexure frame leg terminals; and/or the flexure tongue has a distal free end, the flexible circuit distal portion being connected to the tongue distal free end in free end motion limiting relation.

In a particularly preferred embodiment, the invention provides a disk drive suspension comprising a flexible circuit and a one-piece load beam and low stiffness gimbal flexure, the flexible circuit comprising a laminate of a conductor, a plastic film layer and a metal layer, the load beam supporting the flexible circuit and having a distal end comprising a rigid portion having a first thickness, the load beam rigid portion being selectively etched through its the first thickness to define within the plane of the rigid portion the gimbal flexure comprising a generally U-shaped flexure frame generally spaced from the rigid portion across an etching-produced gap, the flexure frame having a proximate end, left and right legs extending distally from the proximate end, and an open distal end, the flexure frame being locally connected at its the left and right legs to the rigid portion across the gap to support the flexure frame in place, the flexure frame having a lesser thickness than the first thickness, the flexure further comprising a flexure tongue having the first thickness and cantilevered from the proximate base end of the flexure frame toward the flexure frame open distal end, the flexible circuit having a distal portion extending beyond the load beam rigid portion and connected to the distal end of the flexure tongue and to each of the flexure frame legs across the flexure frame open distal end, the flexible circuit distal portion being free of its the metal layer except where connected to the flexure tongue or flexure frame legs, whereby flexure tongue movement is limited by the flexible circuit film layer.

In this and like embodiments, typically: the gimbal flexure frame is surface etched to the lesser thickness; the flexure frame legs have distal terminals and flexible circuit distal portion is connected to the flexure frame leg terminals; and the flexure tongue has a distal free end, the flexible circuit distal portion being connected to the tongue distal free end in free end motion limiting relation.

The invention in its method aspects provides the method of forming a disk drive suspension having a low stiffness gimbal flexure comprising a flexure frame and tongue formed in one piece with a load beam of a given thickness, including setting off the flexure frame from the load beam rigid portion by etching around the flexure frame, reducing the frame thickness by partial etch, setting off the flexure tongue from the flexure frame by etching while maintaining the flexure tongue thickness at the given thickness, and completing the flexure frame by connecting a flexible conductor comprising a laminate of a metal layer, a plastic film layer and conductors to the distal end of the frame, connecting the flexible conductor to the flexure tongue, and removing the metal layer in the flexible conductor except at each locus of connection of the flexible conductor to the flexure frame and tongue.

BRIEF DESCRIPTION OF THE DRAWINGS

The invention will be further described in conjunction with the attached drawings, in which.

DETAILED DESCRIPTION

Figure 1:
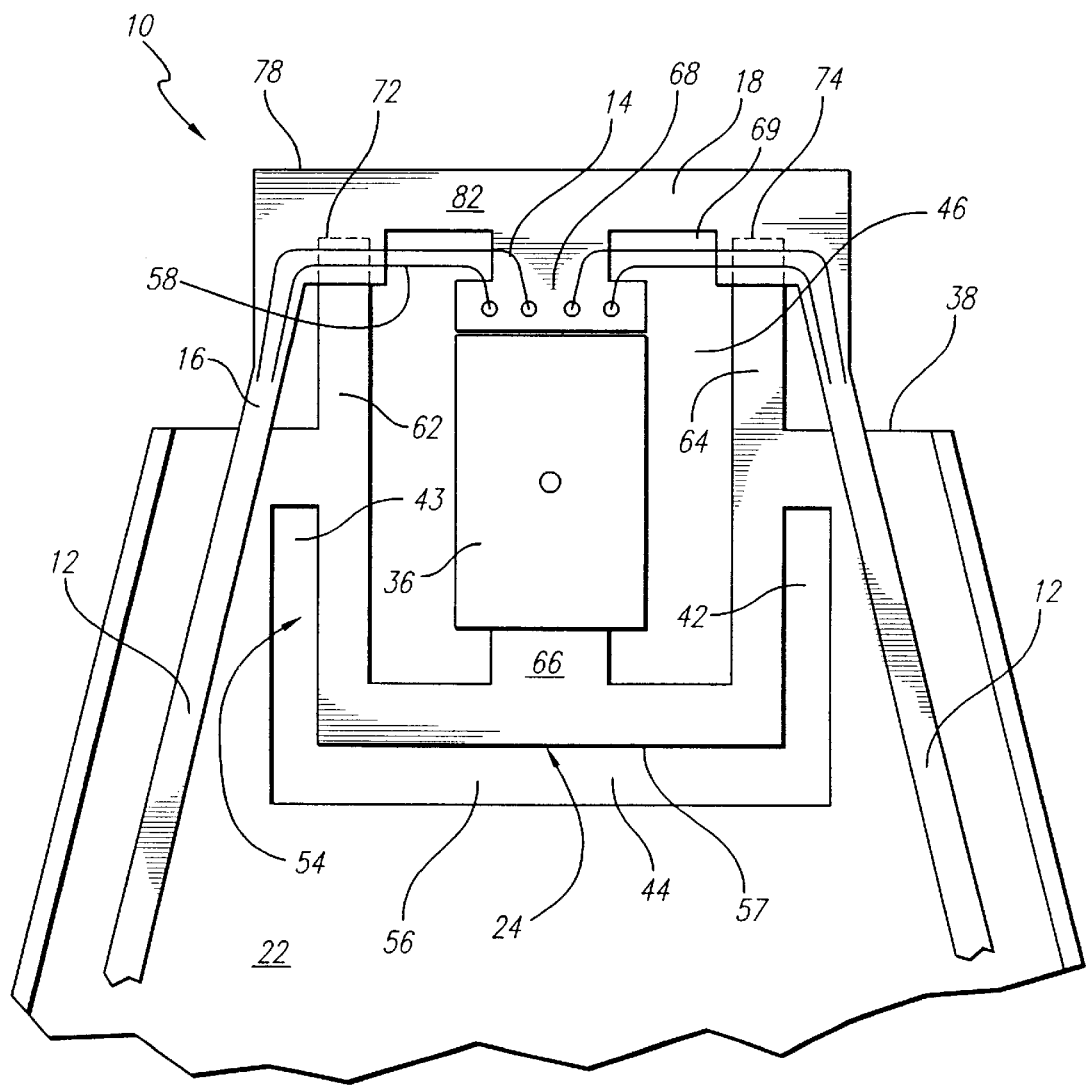
FIG. 1 is a plan view of the slider or first side of the invention suspension.
Figure 2:
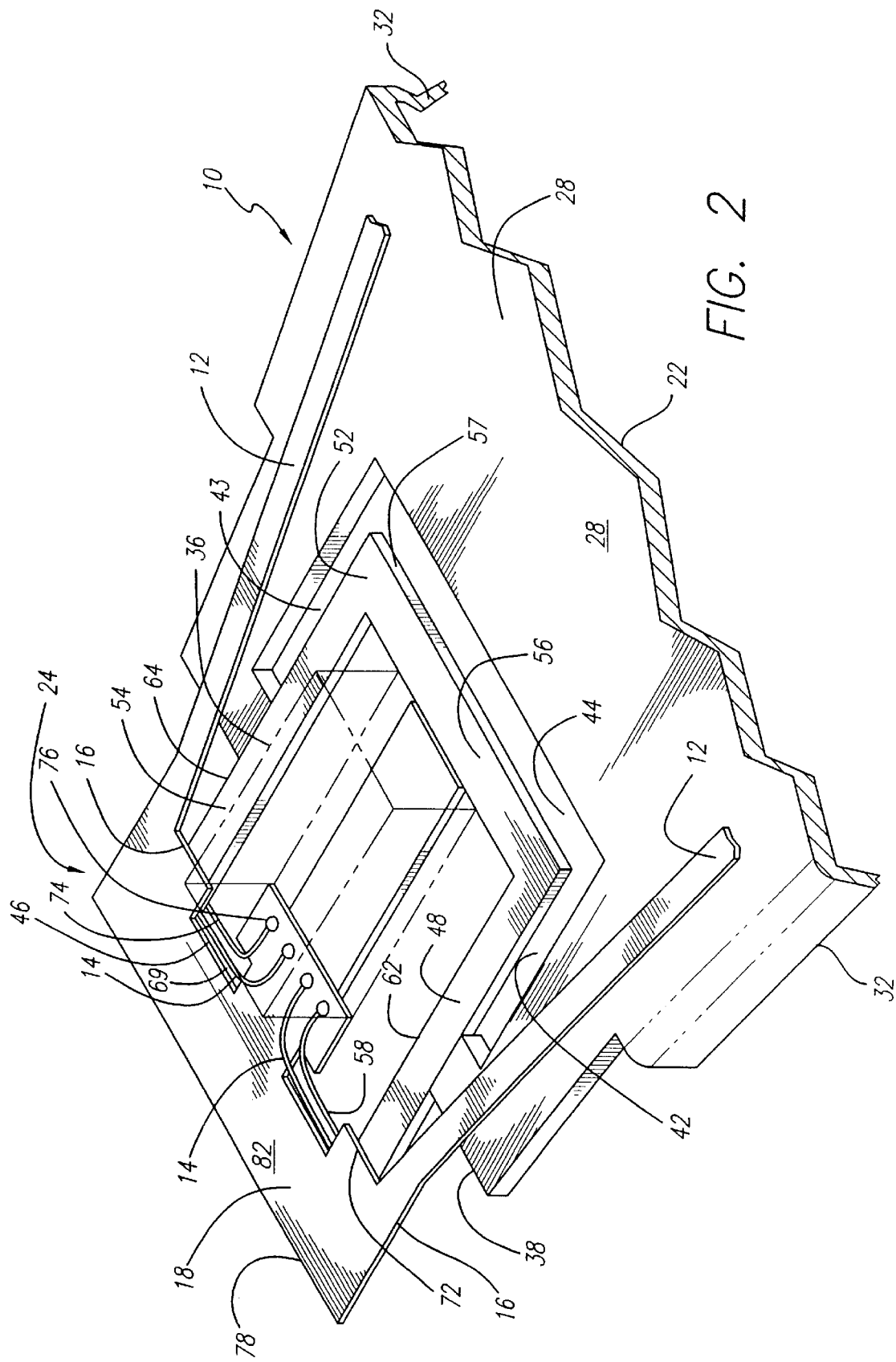
FIG. 2 is an oblique view thereof.
Figure 3:
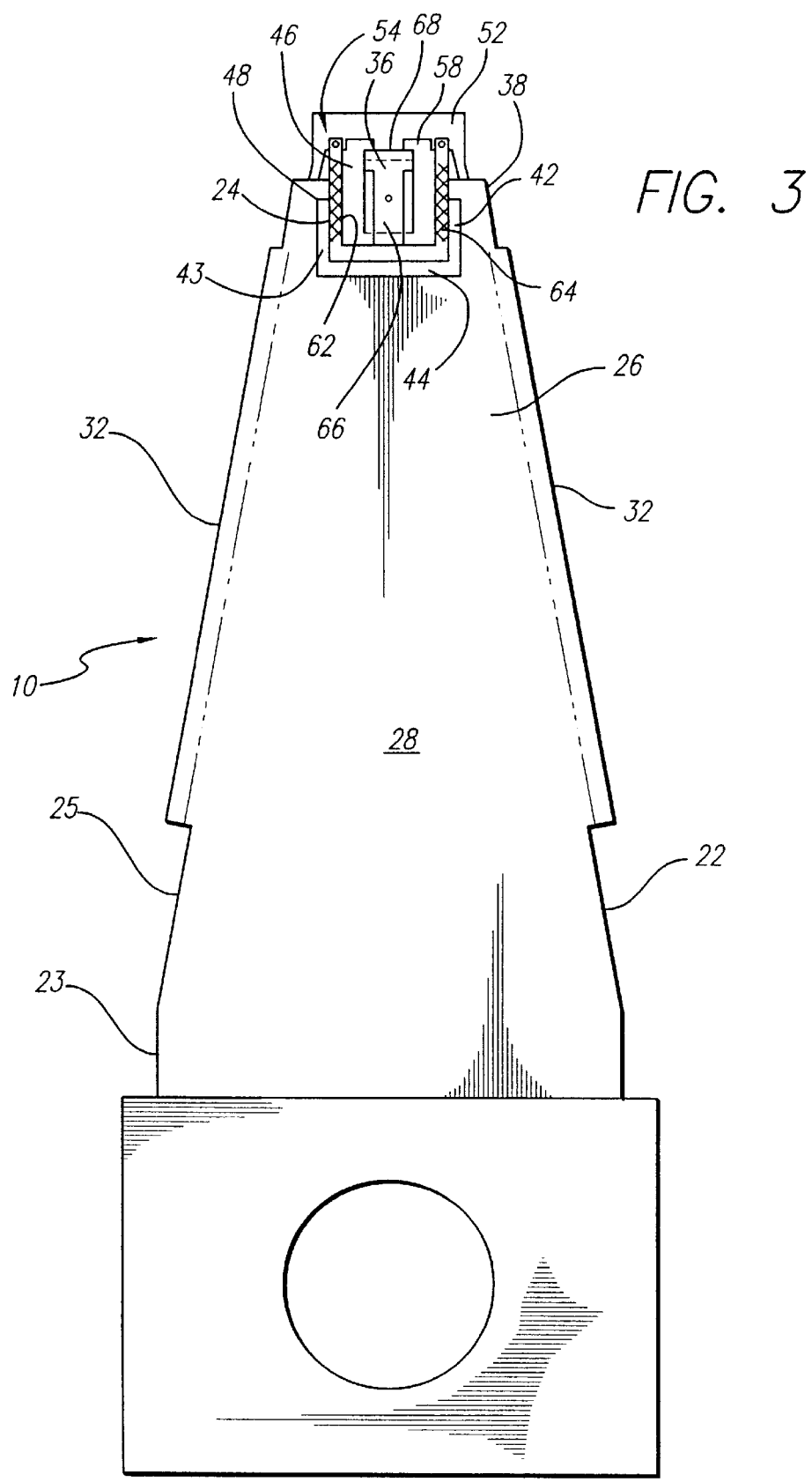
FIG. 3 is a plan view of the second side of the invention suspension.

In general the invention provides a gimbal flexure useful in a wireless suspension, one in which the conductors are part of a laminate of plastic and a spring metal base as well as conductors. In part the invention is intended to overcome the two-layer problem inherent in use of flexible circuit conductors: the flexible circuit is of necessity above, or below, the flexure in a second plane. In this condition the bending of the flexure and flexible circuit are not coincident in time or space and the flexure performance is adversely affected. The invention further is intended to overcome the known problems with integrated flexures in the so-called one-piece suspensions, such as undue stiffness. Both of these sets of problems are overcome by modifying the formed flexure to eliminate stiffness by partially etching the frame sides and etching completely the frame front end, and reducing the flexible circuit to only its plastic film layer across the open end of the frame.

With reference now to the drawings in detail, the invention disk drive suspension is shown at 10. The suspension comprises flexible circuit 12 comprised of conductors 14, stainless spring steel base layer 16 and a dielectric layer 18 of flexible plastic film, particularly polyimide. The suspension 10 comprises a one-piece structure of a load beam 22 and the low stiffness gimbal flexure 24. The load beam 22 is of generally conventional form comprising a base and spring portions 23, 25, respectively, and a rigid portion 26 comprising a triangular web 28 having edge rails 32 bent out of plane to stand normal to the web. The rails 32 extend forward to approximately the centerline of the slider 36.

At the distal end 38 of the load beam rigid portion 26 the load beam web 28 is selectively etched to accomplish several objectives. Initially, the web is etched through at locations 42, 43, 44, and 46. Etching at through-etch locations 42 and 43 frees from the load beam web 28 sides 48, 52 of the flexure frame 54, as shown. Flexure frame rear cross-piece 56 at the flexure frame proximate end 57 is freed from the web 28 by through-etch at location 46. At location 46 the through etch also eliminates the web 28 at what would normally be the front, or distal cross piece of the flexure frame 54 leaving a gap 58 instead for purposes to be seen, forming a generally U-shaped flexure frame.

U-shaped flexure frame 54 is within the plane of the web 28 and has left and right legs 62, 64 extending distally from the flexure proximate end 57 denoted by cross-piece 56. Legs 62, 64 are partially etched by about one-half of their original thickness, a 50% reduction in original thickness (the load beam web 28 thickness). This partial etch can be more or less in different embodiments, e.g. from 10% to 75% etch reduction in frame leg thickness, the objective being to produce a relatively greater or lesser flexibility in the legs 62, 64 for the purposes of the invention.

The flexure frame 54 partly surrounds the flexure tongue 66 that remains after the initial through-etch in locations 44. Preferably the tongue 66 is not partially etched but remains at its full, original thickness, the same as the web 28 thickness. Tongue 66 is attached to the flexure frame rear cross-piece 56 and is cantilevered from there to have its free end 68 be its distal end. This is in contrast to the usual orientation of flexure tongues, and provides in the invention improved gimbaling and linear pitch motion.

The flexure frame 54 has an open distal end 69 between the ends 72, 74 of the frame legs 62, 64. The absence of a complete frame determined by the missing cross-piece at the distal end 69 substantially reduces the stiffness of the flexure frame 54. To connect the leg ends 72, 74, use is made of the flexible plastic film layer 18 of the flexible circuit 12. The conductors 14 are separated from the flexible circuit to be connected to the pads 76 and effect the electrical connection of the slider 36 to the device electronics (not shown). The forwardmost portion 78 of the flexible circuit 12 is locally connected to the flexure frame leg ends 72, 74 by typically by adhesive between the ends and the metal base layer 16 of the flexible circuit. The forwardmost flexible circuit portion 78 is further similarly connected to the distal end 68 of the tongue 66.

In advance of making the just-described connections, the metal base layer 16 is removed from the balance of the flexible circuit forwardmost portion 78 leaving just the flexible plastic film layer 18 as a connector 82. Thus the leg ends 72, 74 are lightly joined to each other and to the tongue 66 distal end 69. The plastic film connector 82 in addition to being light in weight, is somewhat stretchy to facilitate flexure responsiveness with minimum restraint. The flexure tongue 66 benefits from being lightly but effectively tethered against unduly large excursions and is better able to gimbal as required without the trammelling a more substantial, less flexible, less accommodating limiter might impose.

The invention thus provides a disk drive suspension having a low stiffness gimbal flexure, partially formed from the load beam, and partially from flexible circuit, the suspension gimbal flexure having a frame and tongue etched from the load beam, the frame being locally partially etched to reduce frame stiffness, but not the tongue, and the frame sides defining an open end and coupled to each other at their distal ends across the frame open end by the flexible circuit, the flexible circuit itself in its nonconductive components being reduced to its dielectric layer except where connected to the frame and tongue to provide a soft linking of the frame sides across the open end of the frame. The foregoing objects are thus met.

I claim:

1. A disk drive suspension having a low stiffness gimbal flexure and comprising a flexible circuit and a one-piece load beam and gimbal flexure, said flexible circuit comprising a laminate of a conductor and a plastic film layer, said load beam supporting said flexible circuit and having a distal end comprising a rigid portion, said load beam rigid portion being selectively etched to define within the plane of said rigid portion said gimbal flexure comprising a flexure frame generally spaced from said rigid portion across a gap, said flexure frame having frame sides, a proximate end and a distal end, and a flexure tongue cantilevered from said proximate end of said flexure frame, said flexible circuit having a distal portion extending beyond said load beam rigid portion and connected to the distal end of said flexure tongue and to each of said flexure frame sides.

2. The disk drive suspension according to claim 1, in which said load beam rigid portion has a first thickness, and said gimbal flexure frame is reduced to a second, lesser thickness for lower stiffness in said gimbal flexure.

3. The disk drive suspension according to claim 2, in which said gimbal flexure frame is surface etched to said lesser thickness.

4. The disk drive suspension according to claim 1, in which said tongue has a greater thickness than said gimbal flexure frame.

5. The disk drive suspension according to claim 4, in which said load beam rigid portion has a first thickness, said gimbal flexure frame has a second, lesser thickness, and said tongue has the thickness of said load beam rigid portion.

6. The disk drive suspension according to claim 1, in which said gimbal flexure frame is generally U-shaped.

7. A disk drive suspension having a low stiffness gimbal flexure and comprising a flexible circuit and a one-piece load beam and gimbal flexure, said flexible circuit comprising a laminate of a conductor and a plastic film layer, said load beam supporting said flexible circuit and having a distal end comprising a rigid portion, said load beam rigid portion being selectively etched to define within the plane of said rigid portion said gimbal flexure comprising a flexure frame generally spaced from said rigid portion across a gap, said flexure frame having left and right legs defining left and right frame sides, a proximate end and a distal end, and a flexure tongue cantilevered from said proximate end of said flexure frame, said flexible circuit having a distal portion extending beyond said load beam rigid portion and connected to the distal end of said flexure tongue and to each of said flexure frame left and right sides, said gimbal flexure frame being generally U-shaped and having its said left and right legs extending distally from said proximate end, and an open distal end, said flexure frame being supported on said load beam rigid portion intermediate the length of said flexure frame legs.

8. The disk drive suspension according to claim 7, in which said flexure frame legs have distal terminals and said flexible circuit distal portion is connected to said flexure frame leg terminals.

9. The disk drive suspension according to claim 8, in which said flexure tongue has a distal free end, said flexible circuit distal portion being connected to said tongue distal free end in free end motion limiting relation.

10. A method of forming a disk drive suspension having a low stiffness gimbal flexure comprising a flexure frame and tongue formed in one piece with a load beam rigid portion of a given thickness, including setting off the flexure frame from the load beam rigid portion by etching around the flexure frame, reducing the frame thickness by partial etch, setting off the flexure tongue from the flexure frame by etching while maintaining the flexure tongue thickness at said rigid portion given thickness, and completing the flexure frame by connecting a flexible conductor comprising a laminate of plastic film layer and conductors to the distal end of the frame, and connecting said flexible conductor to said flexure tongue.

* * * * *